Figure 1:
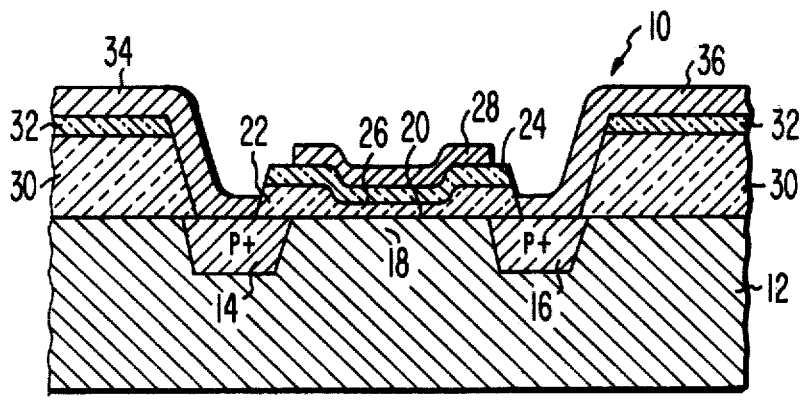

United States Patent [19]

Khajezadeh

[11] 4,305,086
[45] Dec. 8, 1981

[54] MNOS MEMORY DEVICE AND METHOD OF MANUFACTURE

[75] Inventor: Heshmat Khajezadeh, Somerville, N.J.

[73] Assignee: RCA Corporation, New York, N.Y.

[21] Appl. No.: 70,020

[22] Filed: Aug. 27, 1979

Related U.S. Application Data

[63] Continuation of Ser. No. 873,605, Jan. 30, 1978, abandoned.

[51] Int. Cl.³ ............................................. H01L 29/34
[52] U.S. Cl. ................................... 357/54; 357/23; 357/91
[58] Field of Search ........................... 357/23, 54, 91; 148/1.5

[56] References Cited

U.S. PATENT DOCUMENTS 4,047,974 9/1977 Harari .................................. 357/54

Primary Examiner—Edward J. Wojciechowicz
Attorney, Agent, or Firm—Birgit E. Morris; Donald S. Cohen; Sanford J. Asman

[57] ABSTRACT

A metal nitride oxide semiconductor (MNOS) memory device having improved memory retention capability is described. Improved memory retention is obtained by ion implanting a non-doping material, such as argon or nitrogen, or a low concentration of an N type dopant, such as phosphorus, into the oxide before depositing the nitride layer. It is believed that the ion implantation results in a nitride-oxide interface conducive to charge storage. The MNOS device produced has a considerably improved memory retention characteristic when compared with an MNOS device which did not have the ion implantation.

12 Claims, 5 Drawing Figures

MNOS MEMORY DEVICE AND METHOD OF MANUFACTURE

This is a continuation of application Ser. No. 873,605, filed 1-30-78, now abandoned.

The present invention relates to semiconductor devices, and in particular relates to MNOS devices used as memories.

Heretofore it has been known that a field effect transistor of the MNOS type could be made to exhibit two threshold states representative of two memory states. In particular, a device could exhibit a high threshold state, in which its threshold is on the order of 8.5 volts, or a low threshold state, in which its threshold voltage is on the order of 3.5 volts. Placing a large negative "Write" voltage, i.e. −27 volts, on the gate of a P channel MNOS device causes holes to travel to the silicon dioxide-silicon nitride interface where they are trapped. The trapped holes cause the device to exhibit an increased threshold voltage, because it is necessary to overcome the field created by the trapped holes before a conductive channel can be induced. Thus, the threshold voltage is typically increased to about 8.5 volts from 3.5 volts by the aforementioned "Write" voltage, so when a 6 volt "Read" signal is applied to the gate, the device acts like an open circuit.

On the other hand, if an "Erase" voltage, typically a high valued positive voltage, i.e. as +27 volts, is applied to the gate the trapped holes will tunnel from the nitride-oxide interface back into the substrate and the device will revert to a low threshold voltage on the order of 3.5 volts. Accordingly, if a "Read" voltage on the order of 6 volts is applied to the gate of the device a channel will be induced between the source and the drain and the device will act like a closed circuit.

A problem which heretofore existed with such MNOS devices related to their ability to retain holes at the nitride-oxide interface for long periods of time without applying a new "Write" voltage to the gate, i.e. without reprogramming.

Referring to the drawing:

FIG. 1 is a cross-sectional view of the MNOS device of the present invention; and FIGS. 2-5 are cross-sectional views showing the method of manufacturing the device of FIG. 1.

Referring now to FIG. 1, the MNOS device 10 of the present invention is shown. The device 10 is comprised of an N type substrate 12 having a P+ source 14 and a P+ drain 16 formed therein. The source 14 and drain 16 are separated by a channel region 18. On the surface 20 of the substrate 12, overlying the channel region 18 is a gate oxide 22, which is comprised of silicon dioxide in the preferred embodiment of the present invention. Overlying the gate oxide 22 is a layer of silicon nitride 24, there being an interface 26 between the silicon dioxide layer 22 and the silicon nitride layer 24. A conductive gate 28, made of a metal such as aluminum, which is used in the preferred embodiment of the invention, or of a conductive polycrystalline silicon layer overlies the silicon nitride layer 24.

Outside the active region of the transistor 10 is a thick field oxide 30, also of silicon dioxide in the preferred embodiment. The field oxide 30 is covered by a silicon nitride layer 32. A metallic contact 34 forms an ohmic contact to the P+ source 14 and another metallic contact 36 forms an ohmic contact to the P+ drain 16. Both the source and drain contacts 34, 36 are made of the same material as the gate 28.

While the MNOS device 10 has a conventional structure, it is made with an ion implantation into the gate oxide 22 which considerably improves the retention capability of the device 10 as will be explained hereinafter.

Figure 2:
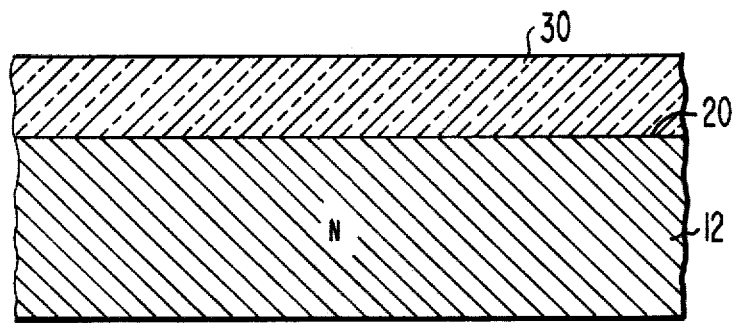

Referring now to FIG. 2, one forms the MNOS device 10 of the present invention by starting with an N type substrate 12, preferably having a conductivity on the order of 0.5 to 0.8 ohm-cm and having a surface 20. A thermal oxide layer 30 is formed on the surface 20 to a thickness of from about 7000 Å to 10,000 Å. In the preferred embodiment of the invention, the oxide layer 30 is formed by thermally oxidizing the substrate 12 for about one hour in an oxidation furnace heated to about 1165° C. into which a small quantity of steam and HCl are injected.

Following the formation of the oxide layer 30, a layer of photoresist (not shown) is applied to the exposed surface of the oxide layer 30 and is defined and developed for use as an etching mask for exposing the portions of the surface 20 overlying the areas where the source 14 and drain 16 are to be formed.

Figure 3:
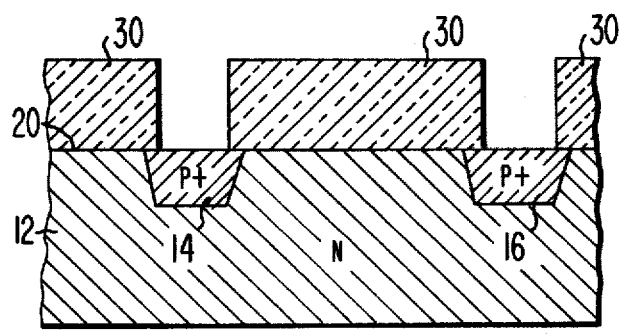
Figure 4:
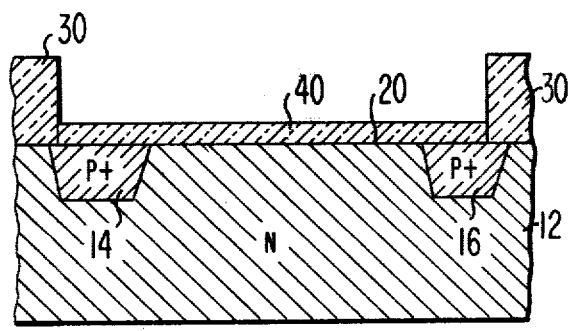

Referring to FIG. 3, boron impurities are next deposited on the exposed areas of the surface 20 in a diffusion furnace heated to about 950° C. for about 45 minutes. In the preferred embodiment of the invention, boron nitride is used as the dopant, and the surface concentration following the deposition is about $10^{19}$ atoms/cm$^3$. Next, there is a drive-in diffusion for about 100 minutes at about 1100° C. after which the surface concentration is about $4 \times 10^{18}$ atoms/cm$^3$ which results in the formation of the drain 14 and the source 16 with each extending about 2 microns into the substrate 12 from the surface 20. It would be possible to use ion implantation to form the drain 14 and source 16 if desired, as will be obvious to one skilled in the art.

Following the drive-in diffusion, a second photoresist layer (not shown) is applied over the surface of the remaining portions of the oxide layer 30 and over the exposed portions of the surface 20. The second photoresist layer is defined and developed in order to expose the source 14, the drain 16, and intermediate regions of the oxide layer 30 which are then etched to remove the portion of the oxide layer 30 overlying the surface 20 between the source 14 and the drain 16, i.e. over the channel region 18 as shown in FIG. 1. Next, a new oxide 40 is grown over the exposed portions of the surface 20 for about 15 minutes at about 1000° C. to a thickness of about 500 Å.

Following the growth of the oxide layer 40 a third layer of photoresist (not shown) is applied over the surface of the oxide layers 30, 40 and is defined and developed to expose the central portion of the oxide layer 40 which is then etched to expose the surface 20. This etch, as well as the ones proceeding it of silicon dioxide, may be performed using buffered hydrofluoric acid.

Figure 5:
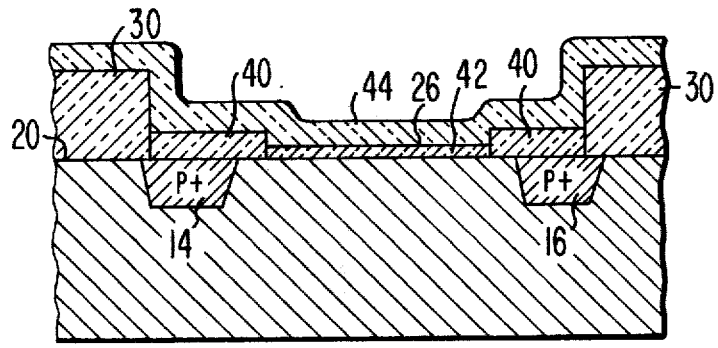

Next, a thin oxide 42 having a thickness of about 20 Å is grown over the exposed surface 20 at about 580° C. for about 30–45 minutes in an oxidizing environment including HCl and steam to produce the structure shown in FIG. 5.

Following the formation of the thin oxide layer 42, the inventor performs an ion implantation into the oxide layers 40 and 42 prior to the formation of the nitride layer 24 which will overlie the gate oxide 22 formed by the oxide layers 40 and 42 overlying the channel region 18 shown in FIG. 1. The ion implantation affects the oxide-nitride interface in a manner which considerably improves the retention characteristics of the MNOS device 10 compared to similar devices without such an ion implantation. While the exact mechanism which improves the device's retention capability is not known, the inventor believes that the ion implantation affects the structure of the interface in a manner which prevents trapped holes from escaping from the interface. In view of the fact that the purpose of the ion implantation is to "damage" the oxide surface in order for the oxide-nitride interface to act as a better trap for charge, the implanted ions may be either a donor impurity, such as phosphorus, or a non-dopant, such as argon or nitrogen. In the preferred embodiment of the invention, phosphorus is ion implanted at 35 KeV to a total dose of about $5 \times 10^{12}$ atoms/cm$^2$. Similar doses of non-dopants could be used, but it is thought that the implanted dose of a non-dopant is not critical.

With continued reference to FIG. 5, a layer of silicon nitride (Si$_3$N$_4$) 44 is deposited by chemical vapor deposition (CVD) over the surface of the oxides 30, 40, 42 to a thickness of about 500 Å. The deposition of the CVD silicon nitride layer 44 is accomplished by combining silane (SiH$_4$) and ammonia (NH$_3$) in a deposition reactor heated to about 800° C. for about 30 minutes.

Following the formation of the silicon nitride layer 44 a fourth layer of photoresist (not shown) is applied to the surface of the nitride layer 44 and is defined and developed. Using the photoresist layer as a mask, phosphoric acid is used to etch openings through the nitride layer 44 to the oxide layer 40 in order to expose the oxide 40 over the source 14 and drain 16. Then, the photoresist layer is removed and the exposed portions of the oxide layer 40 are etched in buffered hydrofluoric acid, thereby exposing the surface 20 of the substrate 12 over the source 14 and drain 16. An aluminum layer (not shown) is then deposited over the surface of the nitride layer 44 and over the surface 20 source 14 and drain 16. Using a fifth photomask layer (not shown) and an etchant, the aluminum layer is defined to form the gate 28, the source contact 34 and the drain contact 36 as shown in FIG. 1. The remaining portions of the oxide layers 40, 42 shown in FIG. 1 are referred to by reference numeral 22. Also, the remaining portion of the nitride layer 44 which overlies the gate oxide 22 is referred to by reference numeral 24 and the remaining portions of the nitride layer 44 overlying the field oxide 30 are referred to in FIG. 1 by reference numeral 32. It has been found that the MNOS device 10 can be subjected to 1000 Write-Erase cycles in which the gate 28 is placed at +27 volts and −27 volts, respectively, followed by 10$^7$ Read cycles at +6 volts, and that the device 10 will provide 7 years of memory retention without reprogramming at 100° C. ambient junction temperature.

What is claimed is:

1. An improved method of forming an MNOS device of the type comprising the steps of:
   (a) selecting a substrate having a first impurity type;
   (b) forming a spaced source and drain of opposite conductivity type extending into said substrate from a surface thereof;
   (c) forming a silicon dioxide layer on the surface of said substrate at least between said source and said drain;
   (d) forming a silicon nitride layer over the surface of said silicon dioxide layer; and
   (e) forming a continuous conductive gate over said silicon nitride layer at least overlying a portion of said source and said drain;
   wherein the improvement comprises implanting ions selected from the group consisting of a non-dopant and a dopant having the same impurity type as said substrate into said silicon dioxide layer, said step of implanting occurring immediately prior to said step of forming a silicon nitride layer.

2. The method of claim 1 wherein said substrate has N type conductivity and said implanted ions are ions of phosphorus.

3. The method of claim 2 wherein said phosphorus ions are implanted at an energy level of about 35 KeV.

4. The method of claim 3 wherein said ion implantation is continued until there has been a total implantation dose of about $5 \times 10^{12}$ atoms/cm$^2$.

5. The method of claim 1 wherein said non-dopant ions are selected from the group consisting of argon and nitrogen.

6. The method of claim 5 wherein said ion implantation step is conducted at an energy of about 35 KeV.

7. The method of claim 6 wherein said ion implantation step is continued until a total dose of about $5 \times 10^{12}$ atoms/cm$^2$ has been implanted.

8. The MNOS device formed by the method of claim 1.

9. An improved MNOS device of the type comprising:
   (a) a substrate having a first impurity type;
   (b) a source and a drain spaced from said source, both being of conductivity type opposite to said substrate and extending into said substrate from a surface thereof;
   (c) a silicon dioxide layer on the surface of said substrate extending at least between said source and said drain, said silicon dioxide layer having a central portion which is substantially thinner than the portions adjacent either said source or said drain;
   (d) a silicon nitride layer formed on the surface of said silicon dioxide layer; and
   (e) a continuous conductive gate overlying said silicon nitride layer and at least a portion of said source and said drain;
   wherein the improvement comprises damage to said silicon dioxide layer at its interface with said silicon nitride layer caused by ion implantation of ions into said silicon dioxide layer.

10. The device of claim 9 wherein said substrate is N type silicon.

11. The device of claim 10 wherein said damage is caused by ion implanting ions selected from the group consisting of a non-dopant and a dopant having N type impurity.

12. The device of claim 11 wherein said implanted ions are phosphorus ions implanted at an energy level at about 35 KeV to a total dose of about $5 \times 10^{12}$ atoms/cm$^2$.

* * * * *